United States Patent
Lin et al.

(10) Patent No.: US 11,784,183 B2
(45) Date of Patent: Oct. 10, 2023

(54) INTER-LEVEL CONNECTION FOR MULTI-LAYER STRUCTURES

(71) Applicant: TAIWAN SEMICONDUCTOR MANUFACTURING COMPANY, LTD., Hsinchu (TW)

(72) Inventors: Yi-Tang Lin, Hsinchu (TW); Clement Hsingjen Wann, Carmel, NY (US); Neng-Kuo Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/084,292

(22) Filed: Dec. 19, 2022

(65) Prior Publication Data

US 2023/0123873 A1    Apr. 20, 2023

Related U.S. Application Data

(60) Continuation of application No. 17/135,778, filed on Dec. 28, 2020, now Pat. No. 11,532,612, which is a
(Continued)

(51) Int. Cl.
*H01L 27/06* (2006.01)
*H01L 23/522* (2006.01)
*H01L 27/088* (2006.01)

(52) U.S. Cl.
CPC ........ *H01L 27/0688* (2013.01); *H01L 23/522* (2013.01); *H01L 27/088* (2013.01); *H01L 2924/0002* (2013.01)

(58) Field of Classification Search
CPC . H01L 27/0688; H01L 23/522; H01L 27/088; H01L 21/76832; H01L 21/82285; H01L 21/8238
See application file for complete search history.

(56) References Cited

U.S. PATENT DOCUMENTS

| 8,546,250 B2 | 10/2013 | Piper |
| 8,674,470 B1 | 3/2014 | Or-Bach et al. |

(Continued)

FOREIGN PATENT DOCUMENTS

| CN | 101345240 A | 1/2009 |
| CN | 100508130 C | 7/2009 |

(Continued)

OTHER PUBLICATIONS

Korean Office Action; Application No. 10-2014-0149296; dated Jun. 18, 2015.
(Continued)

*Primary Examiner* — Didarul A Mazumder
(74) *Attorney, Agent, or Firm* — McDermott Will & Emery LLP

(57) ABSTRACT

Systems and methods are provided for fabricating a semiconductor device structure. An example semiconductor device structure includes a first device layer, a second device layer and an inter-level connection structure. The first device layer includes a first conductive layer and a first dielectric layer formed on the first conductive layer, the first device layer being formed on a substrate. The second device layer includes a second conductive layer, the second device layer being formed on the first device layer. The inter-level connection structure includes one or more conductive materials and configured to electrically connect to the first conductive layer and the second conductive layer, the inter-level connection structure penetrating at least part of the first dielectric layer. The first conductive layer is configured to electrically connect to a first electrode structure of a first semiconductor device within the first device layer.

20 Claims, 16 Drawing Sheets

Related U.S. Application Data continuation of application No. 16/228,985, filed on Dec. 21, 2018, now Pat. No. 10,879,235, which is a division of application No. 14/080,940, filed on Nov. 15, 2013, now Pat. No. 10,163,897.

(56) References Cited

U.S. PATENT DOCUMENTS

| | | |
|---|---|---|
| 2001/0005059 A1 | 6/2001 | Koyanagi et al. |
| 2003/0129829 A1 | 7/2003 | Greenlaw |
| 2003/0146515 A1 | 8/2003 | Kajiyama |
| 2005/0275017 A1 | 12/2005 | Pozder et al. |
| 2007/0267723 A1 | 11/2007 | Bernstein et al. |
| 2009/0002590 A1 | 1/2009 | Kimura |
| 2009/0014796 A1 | 1/2009 | Liaw |
| 2009/0023263 A1 | 1/2009 | Phan et al. |
| 2009/0065941 A1* | 3/2009 | La Tulipe, Jr. ... H01L 21/76804 257/761 |
| 2010/0264551 A1 | 10/2010 | Farooq et al. |
| 2011/0096215 A1 | 4/2011 | Choi et al. |
| 2011/0134683 A1 | 6/2011 | Yamazaki et al. |
| 2012/0181508 A1* | 7/2012 | Chang ............... H01L 29/78684 257/29 |
| 2013/0043554 A1 | 2/2013 | Piper |
| 2013/0179853 A1 | 7/2013 | Bernstein et al. |
| 2014/0252306 A1* | 9/2014 | Du ..................... H01L 29/0673 977/762 |

FOREIGN PATENT DOCUMENTS

| | | |
|---|---|---|
| JP | H04-116851 A | 4/1992 |
| JP | 2003-007849 A | 1/2003 |
| KR | 10-2010-0094905 A | 8/2010 |
| KR | 10-2011-0043867 A | 4/2011 |
| TW | 200924058 A | 6/2009 |

OTHER PUBLICATIONS

Korean Office Action; Application No. 10-2016-0054069; dated Jun. 3, 2016.
Chinese Office Action; Application No. 201410431597.5; dated Feb. 4, 2017.
Korean Office Action issued in corresponding Korean Patent Application No. 10-2017-0078514, dated Sep. 16, 2017.
Korean Notice of Allowance issued in corresponding Korean Patent Application No. 10-2017-0078514, dated Nov. 30, 2017.
Notice of Allowance issued in U.S. Appl. No. 14/080,940 dated Nov. 2, 2018.
Non-Final Office Action issued in U.S. Appl. No. 14/080,940 dated Apr. 17, 2018.
Final Office Action issued in U.S. Appl. No. 14/080,940 dated Nov. 16, 2017.
Non-Final Office Action issued in U.S. Appl. No. 14/080,940 dated May 18, 2017.
Final Office Action issued in U.S. Appl. No. 14/080,940 dated Oct. 20, 2016.
Non-Final Office Action issued in U.S. Appl. No. 14/080,940 dated May 9, 2016.
Non-Final Office Action issued in U.S. Appl. No. 14/080,940 dated Oct. 30, 2015.
Non-final Office Action issued in U.S. Appl. No. 16/228,985, dated May 8, 2020.
Final Office Action issued in U.S. Appl. No. 16/228,985, dated Aug. 21, 2020.
Notice of Allowance issued in U.S. Appl. No. 16/228,985, dated Oct. 30, 2020.
Non-Final Office Action issued in U.S. Appl. No. 17/135,778, dated Mar. 17, 2022.
Notice of Allowance issued in U.S. Appl. No. 17/135,778, dated Aug. 17, 2022.

* cited by examiner

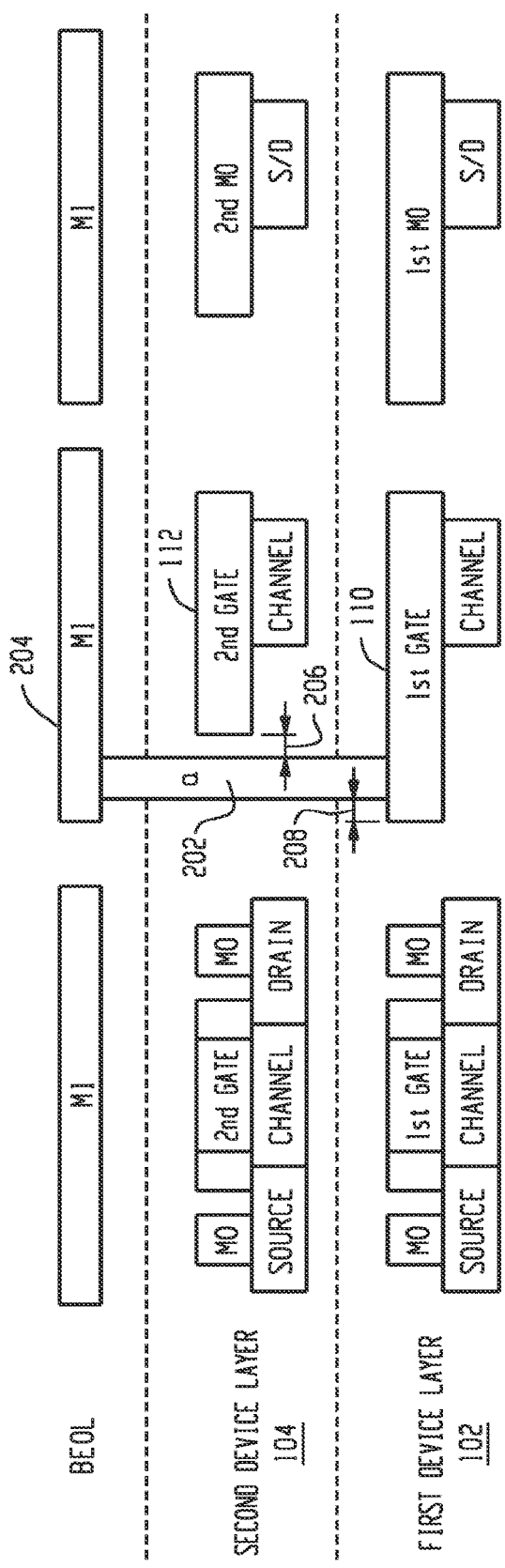
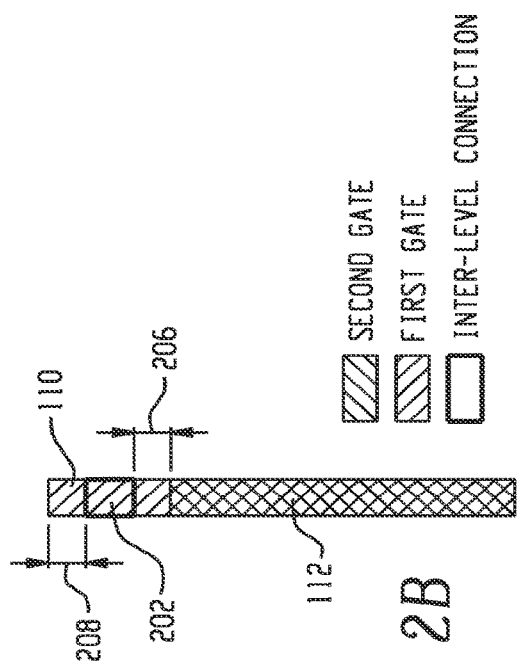
Fig. 2A
Fig. 2B

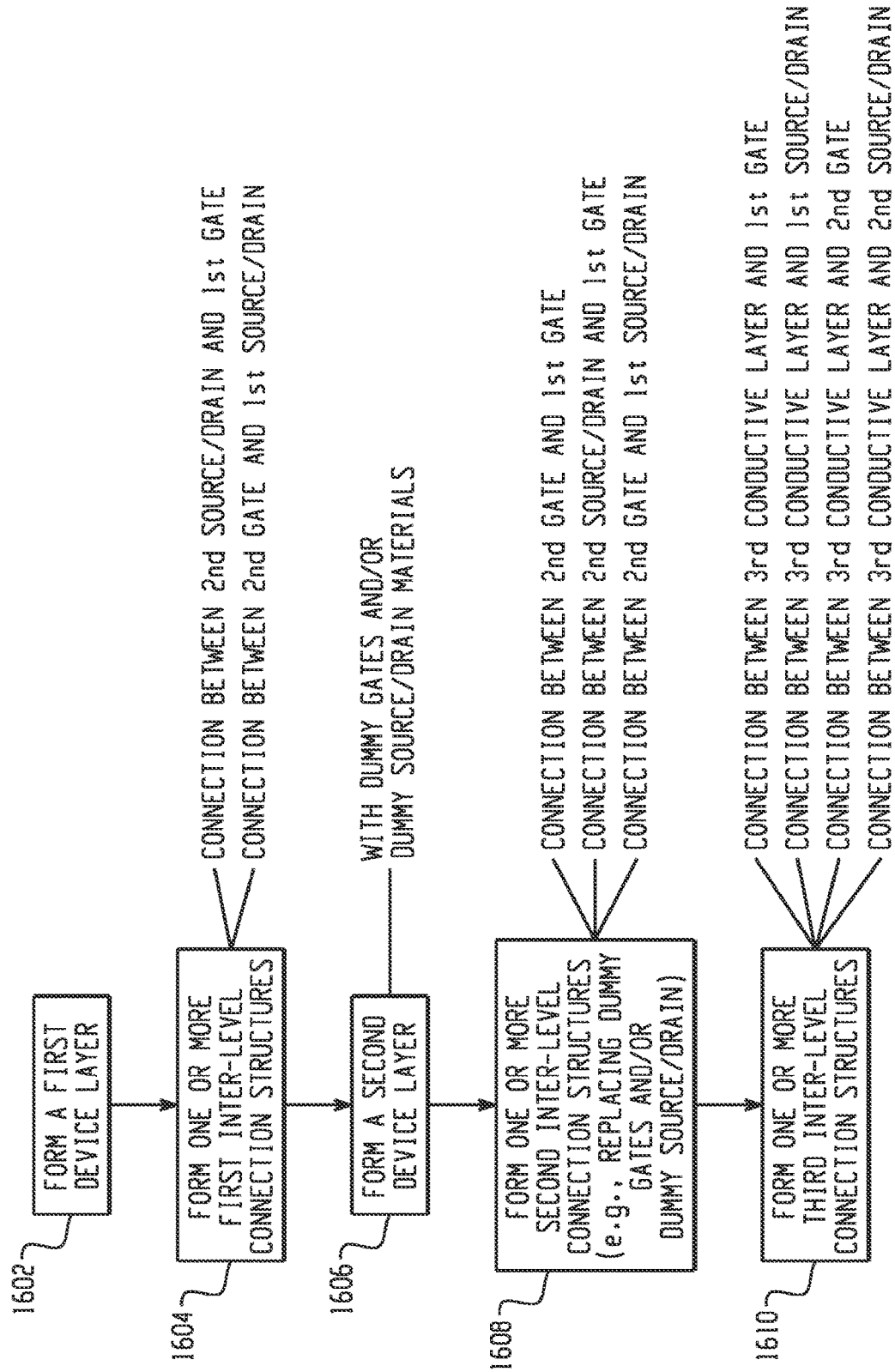

US 11,784,183 B2

INTER-LEVEL CONNECTION FOR MULTI-LAYER STRUCTURES

RELATED APPLICATION

This application is a Continuation Application of U.S. patent application Ser. No. 17/135,778 filed Dec. 28, 2020, now U.S. Pat. No. 11,532,612, which is a Continuation Application of U.S. patent application Ser. No. 16/228,985 filed Dec. 21, 2018, now U.S. Pat. No. 10,879,235, which is a Divisional Application of U.S. patent application Ser. No. 14/080,940 filed Nov. 15, 2013, now U.S. Pat. No. 10,163,897, the entire disclosure of each of which is incorporated herein by reference.

FIELD

The technology described in this disclosure relates generally to semiconductor device structures and more particularly to multi-layer structures.

BACKGROUND

Conventional complementary metal-oxide-semiconductor (CMOS) technology is often implemented to fabricate a large number of semiconductor devices, such as metal-oxide-semiconductor field effect transistors (MOSFETs) and bipolar junction transistors (BJTs), at approximately a same level on a single integrated-circuit (IC) chip.

SUMMARY

In accordance with the teachings described herein, systems and methods are provided for fabricating a semiconductor device structure. An example semiconductor device structure includes a first device layer, a second device layer and an inter-level connection structure. The first device layer includes a first conductive layer and a first dielectric layer formed on the first conductive layer, the first device layer being formed on a substrate. The second device layer includes a second conductive layer, the second device layer being formed on the first device layer. The inter-level connection structure includes one or more conductive materials and configured to electrically connect to the first conductive layer and the second conductive layer, the inter-level connection structure penetrating at least part of the first dielectric layer. The first conductive layer is configured to electrically connect to a first electrode structure of a first semiconductor device within the first device layer.

In one embodiment, a method is provided for fabricating a semiconductor device structure. A first device layer is formed on a substrate, the first device layer including a first conductive layer and a first dielectric layer formed on the first conductive layer. An inter-level connection structure including one or more conductive materials is formed, the inter-level connection structure penetrating through at least part of the first dielectric layer and being connected to the first conductive layer. A second device layer is formed on the first device layer, the second device layer including a second conductive layer connected to the inter-level connection structure. The first conductive layer electrically connects to a first electrode structure of a first semiconductor device within the first device layer.

In the advanced semiconductor technology, to integrate different semiconductor devices onto a single IC chip, more and more process steps may need to be implemented individually for each device to fine tune the electrical performance, such as well and source/drain ion implantation, metal gate work-function tuning, and source/drain epitaxy, which often increase the fabrication costs and complexity. In addition, as more devices are incorporated at approximately the same level on a single IC chip, the size of each device and the spacing between the devices (i.e., feature size) continues to decrease. As a result, the lithography process becomes more and more expensive. Furthermore, materials, such as GaAs and Ge, other than silicon may be implemented to make n-channel and p-channel MOSFETs for better performance. However, it is often difficult to integrate and fabricate devices with GaAs channels and Ge channels on the same substrate at a same time.

BRIEF DESCRIPTION OF THE DRAWINGS

FIGS. 2A-5 depict example diagrams showing different inter-level connection structures within a multi-layer semiconductor device structure.

FIG. 16 depicts yet another example flow chart for fabricating a multi-layer semiconductor device structure.

DETAILED DESCRIPTION

Figure 1:
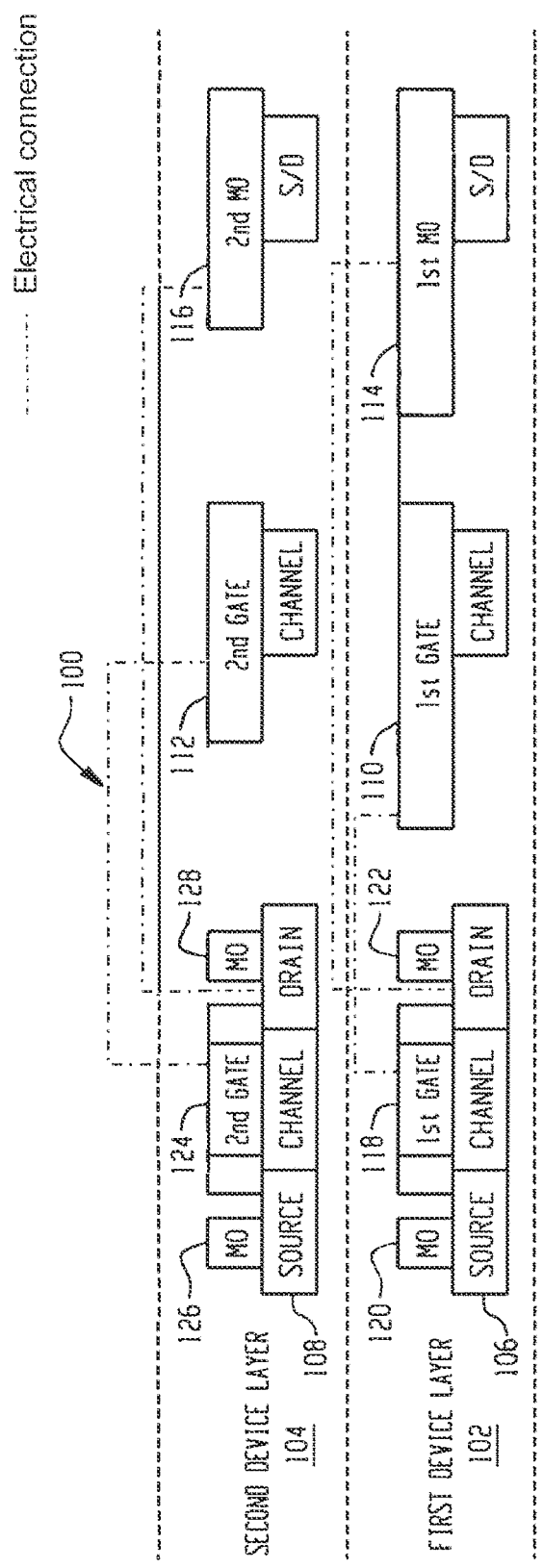
FIG. 1 depicts an example diagram of a multi-layer semiconductor device structure.

FIG. 1 depicts an example diagram of a multi-layer semiconductor device structure. As shown in FIG. 1, the semiconductor device structure 100 may include multiple device layers (e.g., the layers 102 and 104). Each device layer may be used to fabricate one or more semiconductor devices, such as planar MOSFETs, FinFETs, BJTs, diodes, capacitors, etc. For example, transistors 106 and 108 may be fabricated in the device layers 102 and 104, respectively. The transistor 106 may include a gate electrode structure 118, a source electrode structure 120 and a drain electrode structure 122, and the transistor 108 may include a gate electrode structure 124, a source electrode structure 126 and a drain electrode structure 128. For example, the gate electrode structure 118, the source electrode structure 120 and the drain electrode structure 122 may include polycrystalline silicon or metals (e.g., Al, W, Cu).

Conductive layers 110 (e.g., $1^{st}$ Gate) and 112 (e.g., $2^{nd}$ Gate) may be configured to electrically connect to the gate electrode structures 118 and 124, respectively. In addition, conductive layers 114 (e.g., $1^{st}$ M0) and 116 (e.g., $2^{nd}$ M0) may be configured to electrically connect to the source/drain electrode structures of the transistor 106 and 108 respectively. The device layers 102 and 104 may further include one or more dielectric layers (e.g., $SiO_2$, high-k dielectric materials) extending over substantially at least part of the transistors 110 and 112 respectively. Inter-level connection structures may be constructed to connect different conductive layers or electrode structures, as shown by example diagrams in FIGS. 2-13. For example, the conductive layers 110 and 112 may include polycrystalline silicon or metals (e.g., Al, W, Cu).

FIGS. 2A-5 depict example diagrams showing different inter-level connection structures within a multi-layer semiconductor device structure. As shown in FIG. 2A, an inter-level connection structure 202 may be configured to electrically connect to a conductive layer 204 (e.g., M1) fabricated using one or more back-end-of-line (BEOL) processes and the conductive layer 110 (e.g., $1^{st}$ Gate) within the device layer 102. A margin 206 may be kept between the inter-level connection structure 202 and the conductive layer 112 so that they may not be shorted, as shown in FIG. 2A and FIG. 2B. In addition, a sufficient landing area may be kept on the conductive layer 110 for the inter-level connection structure 202. For example, a margin 208 may be kept between the inter-level connection structure 202 and the conductive layer 112. As an example, the margin 206 may be approximately equal to or smaller than a width of the inter-level connection structure 202. The margin 208 may be approximately equal to or smaller than the margin 206.

In one embodiment, the device layer 102 may be fabricated on a substrate (e.g., through a CMOS process). The device layer 104 may be formed on the device layer 102 (e.g., by deposition, or by wafer bonding). For example, a dielectric layer (e.g., bond buried oxide, high-k dielectric materials) may be used as a base/glue/buffer material for the device layer 104. Before the conductive layer 204 is formed during the BEOL processes, an opening (e.g., a vertical opening) may be formed substantially through the device layer 104 and part of the device layer 102 (e.g., a dielectric layer), and one or more conductive materials (e.g., metals or polycrystalline silicon) may be formed (e.g., through deposition) in the opening to generate the inter-level connection structure 202.

Figure 3A:
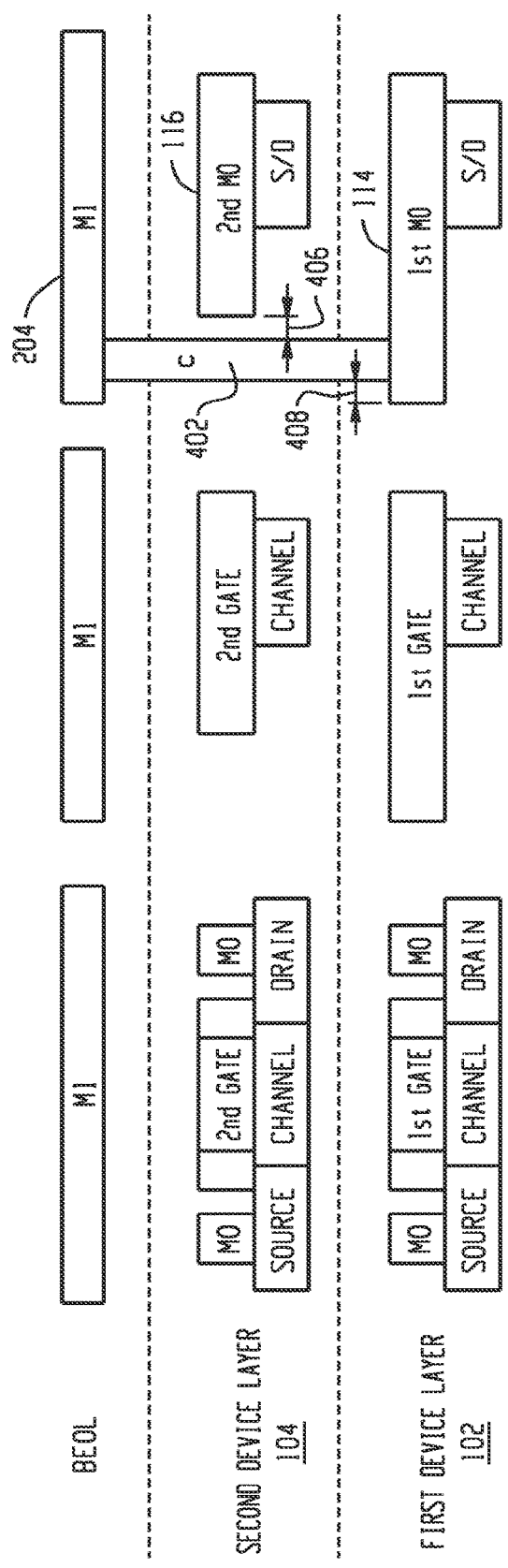
Figure 3B:
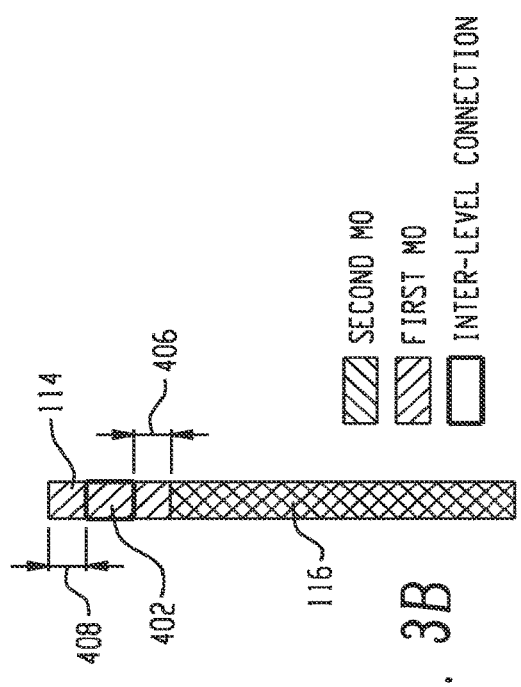

Similarly, as shown in FIG. 3A, an inter-level connection structure 402 may be configured to electrically connect to the conductive layer 204 (e.g., M1) and the conductive layer 114 (e.g., $1^{st}$ M0). A margin 406 may be kept between the inter-level connection structure 402 and the conductive layer 116 (e.g., $2^{nd}$ M0), so that they may not be shorted, as shown in FIG. 3A and FIG. 3B. In addition, a sufficient landing area may be kept on the conductive layer 114 for the inter-level connection structure 402. For example, a margin 408 may be kept between the inter-level connection structure 402 and the conductive layer 114. As an example, the margin 406 may be approximately equal to or smaller than a width of the inter-level connection structure 402. The margin 408 may be approximately equal to or smaller than the margin 406.

Figure 4:
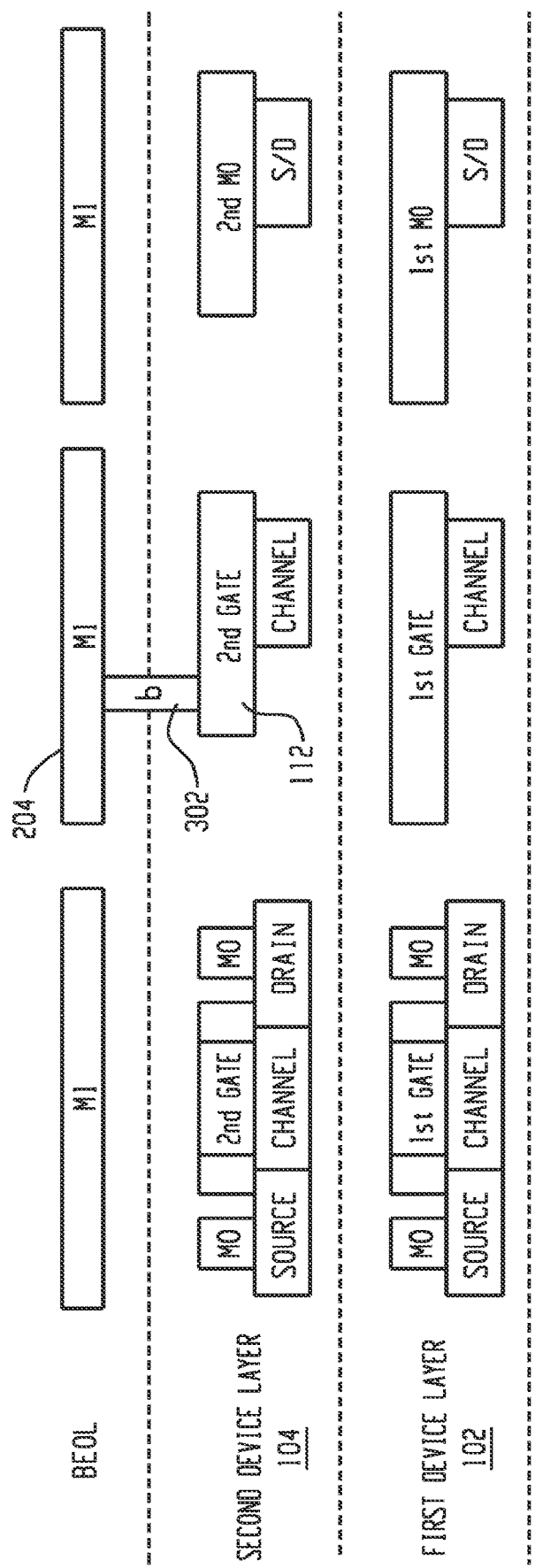

Another inter-level connection structure 302 may be constructed to connect the conductive layer 204 (e.g., M1) and the conductive layer 112 (e.g., $2^{nd}$ Gate) together, as shown in FIG. 4. A sufficient landing area may be kept on the conductive layer 112 for the inter-level connection structure 302. In one embodiment, the device layers 102 and 104 may be fabricated consecutively on a substrate (e.g., through a CMOS process). Before the conductive layer 204 is formed during the BEOL processes, an opening (e.g., a vertical opening) may be formed through part of the device layer 104 (e.g., a dielectric layer), and one or more conductive materials (e.g., metals or polycrystalline silicon) may be formed in the opening to generate the inter-level connection structure 302.

Figure 5:
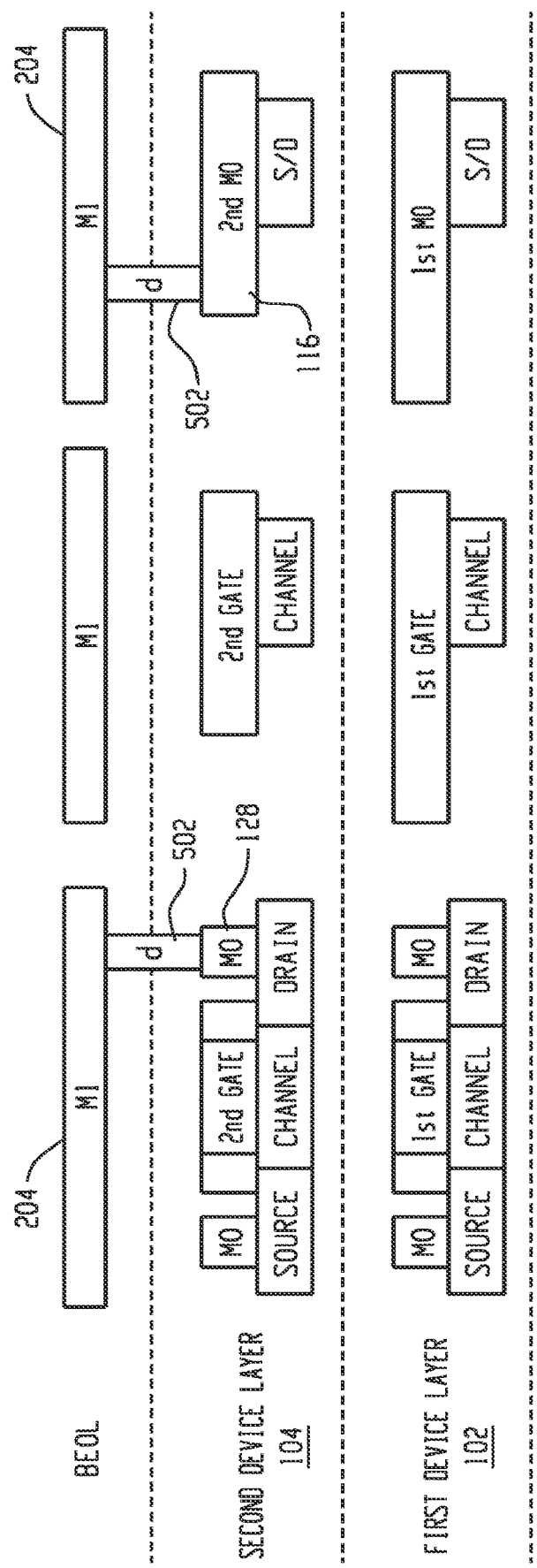

Similarly, an inter-level connection structure 502 may connect the conductive layer 204 (e.g., M1) with the conductive layer 116 (e.g., $2^{nd}$ M0), as shown in FIG. 5. Moreover, another inter-level connection structure 504 may connect the drain electrode structure 128 with the conductive layer 204. In addition, a sufficient landing area may be kept on the conductive layer 116 for the inter-level connection structures 502.

Figure 6A:
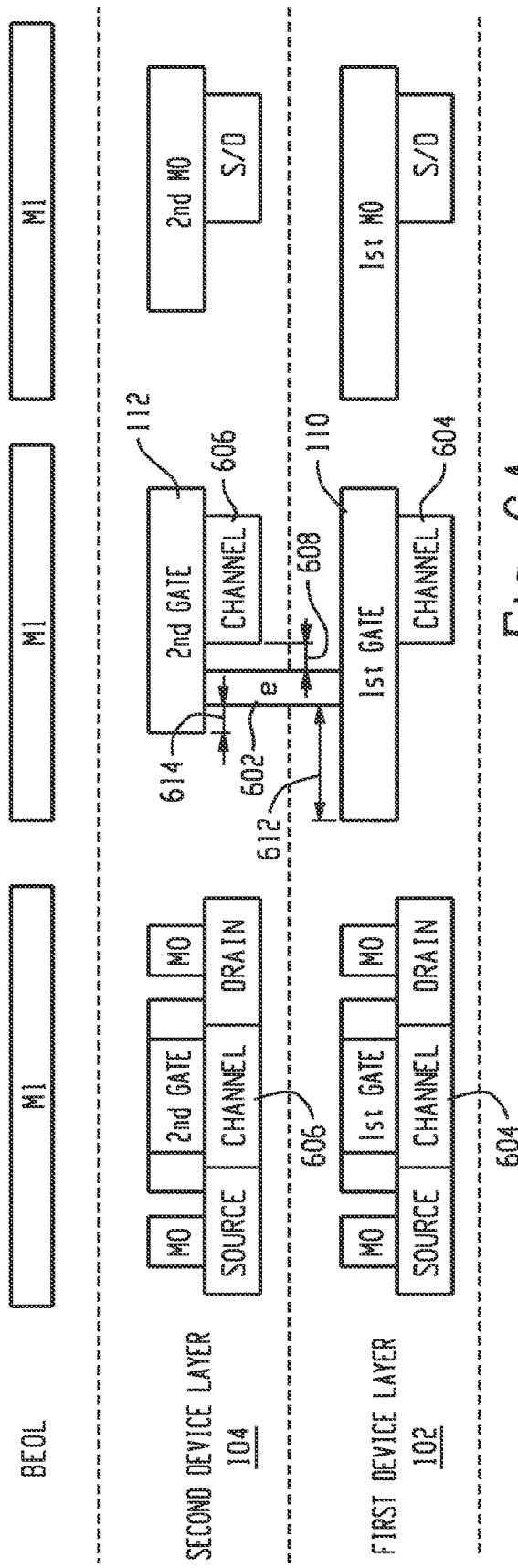
FIGS. 6A-9B depict example diagrams showing different inter-level connection structures between two device layers.

FIGS. 6A-9B depict example diagrams showing different inter-level connection structures between the device layers 102 and 104. As shown in FIG. 6A, an inter-level connection structure 602 may be configured to electrically connect the conductive layer 110 (e.g., $1^{st}$ Gate) and the conductive layer 112 (e.g., $2^{nd}$ Gate) together. Channel layers 604 and 606 may be fabricated (e.g., through oxidation and/or diffusion) substantially under the conductive layers 110 and 112, respectively. For example, one or more thin gate dielectric layers (e.g., $SiO_2$, silicon oxynitride, high-k dielectric materials) may be made to separate the channel layers 604 and 606 from the conductive layers 110 and 112, respectively.

Figure 6B:
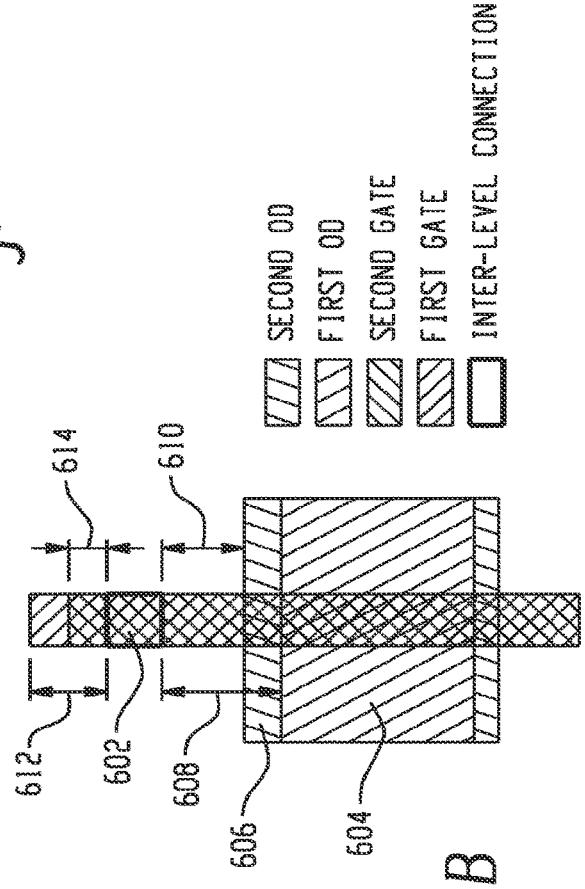

As shown in FIG. 6A and FIG. 6B, a margin 608 may be kept between the inter-level connection structure 602 and the channel layer 604, so that the inter-level connection structure 602 may not land on the conductive layer 110 at an area right above (e.g., vertically) the channel area 604 in order to avoid potential processing variations and reduce the degradation of electrical characteristics. In addition, a margin 610 may be kept between the inter-level connection structure 602 and the channel layer 606, so that they may not be shorted. A sufficient landing area may be kept on the conductive layer 110 for the inter-level connection structure 602. For example, a margin 612 may be kept between the inter-level connection structure 602 and the conductive layer 110. Also, a margin 614 may be kept between the inter-level connection structure 602 and the conductive layer 112. As an example, the margin 610 may be approximately equal to or smaller than a width of the inter-level connection structure 602. The margin 614 may be approximately equal to or smaller than the margin 610. The margin 608 may be approximately equal to or larger than the margin 610. Further, the margin 612 may be approximately twice the margin 614.

In one embodiment, the device layer 102 may be fabricated on a substrate (e.g., through a CMOS process) first, and then part of the device layer 104 (e.g., a dielectric layer, the channel layer 606, and/or a thin gate dielectric) may be formed on the device layer 102. Before the conductive layer 112 is formed, an opening (e.g., a vertical opening) may be formed through part of the device layer 104 and part of the device layer 102 (e.g., a dielectric layer). The inter-level connection structure 602 may then be formed, for example, by depositing one or more conductive materials (e.g., metals or polycrystalline silicon) in the opening. For example, the channel layers 604 and 606 may include silicon carbide, silicon, silicon germanium, germanium, or gallium arsenide.

Figure 7A:
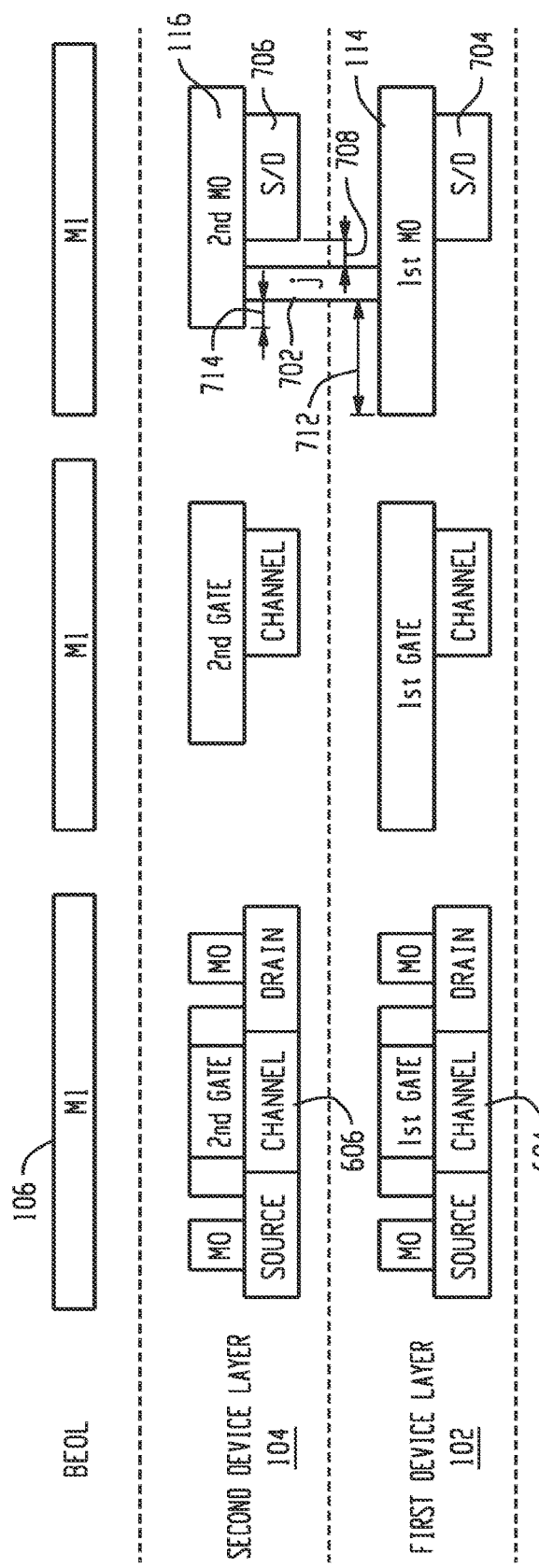
Figure 7B:
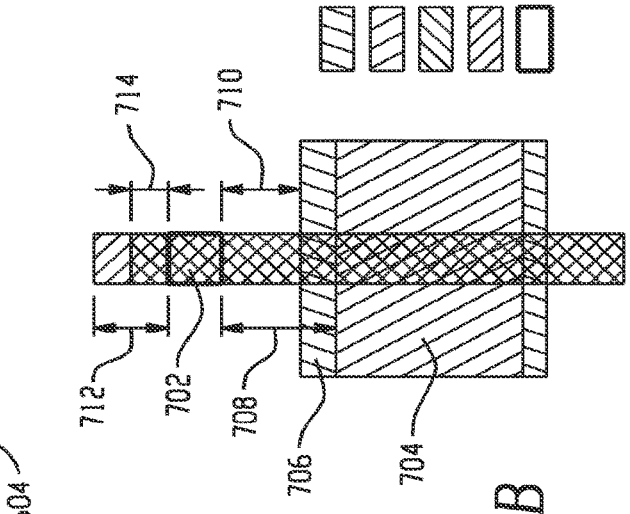

As shown in FIG. 7A, an inter-level connection structure 702 may be configured to electrically connect to both the conductive layer 114 (e.g., $1^{st}$ M0) and the conductive layer 116 (e.g., $2^{nd}$ M0). Source/drain layers 704 and 706 may be fabricated (e.g., through ion implantation and/or epitaxy) under the conductive layers 114 and 116, respectively. A margin 708 may be kept between the inter-level connection structure 702 and the source/drain layer 704, so that the inter-level connection structure 702 may not land on the conductive layer 114 at an area right above (e.g., vertically) the source/drain layer 704. In addition, as shown in FIG. 7A and FIG. 7B, a margin 710 may be kept between the inter-level connection structure 702 and the source/drain layer 706, so that they will not be shorted. A sufficient landing area may be kept on the conductive layer 114 for the inter-level connection structure 702 (e.g., a margin 712 between the inter-level connection structure 702 and the conductive layer 114), and also a margin 714 may be kept between the inter-level connection structure 702 and the conductive layer 116. As an example, the margin 710 may be approximately equal to or smaller than a width of the inter-level connection structure 702. The margin 714 may be approximately equal to or smaller than the margin 710. The margin 708 may be approximately equal to or larger than the margin 710. Further, the margin 712 may be approximately twice the margin 714.

Figure 8A:
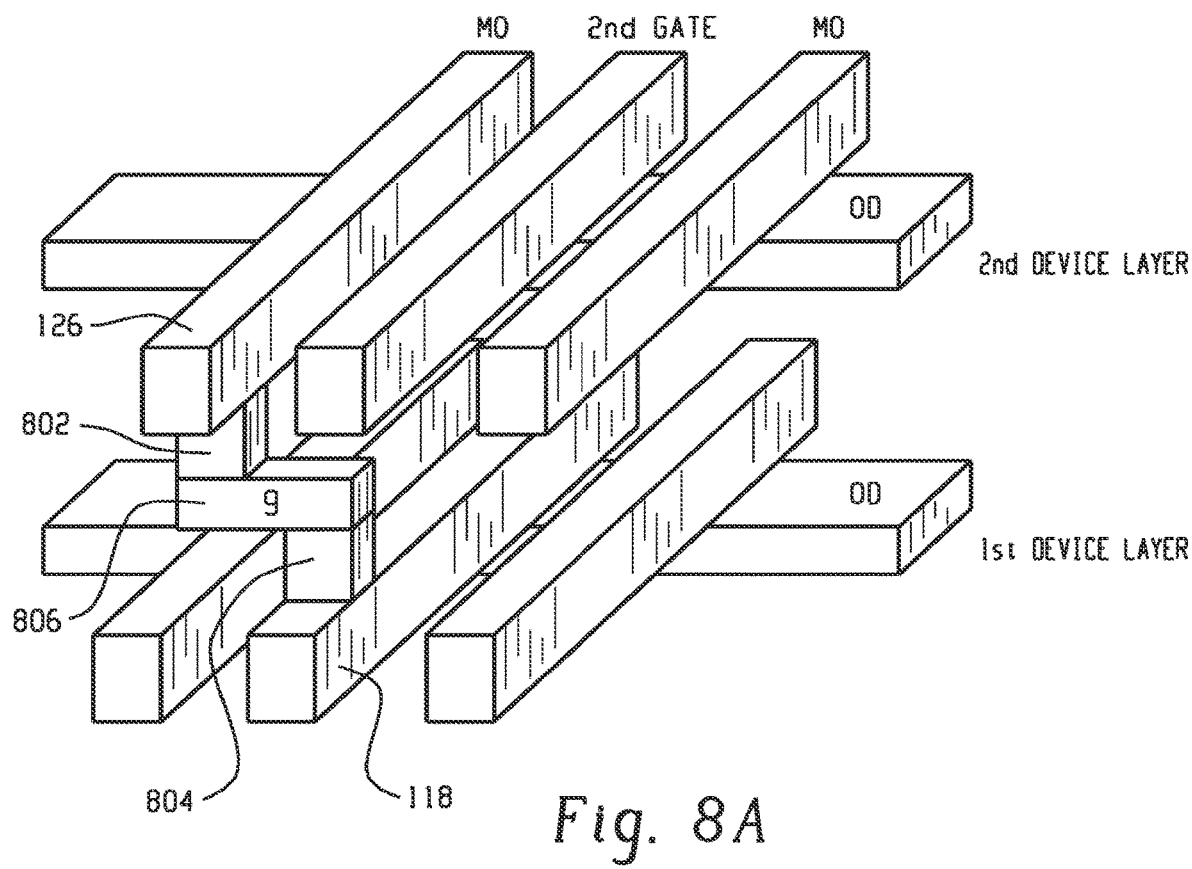
Figure 8B:
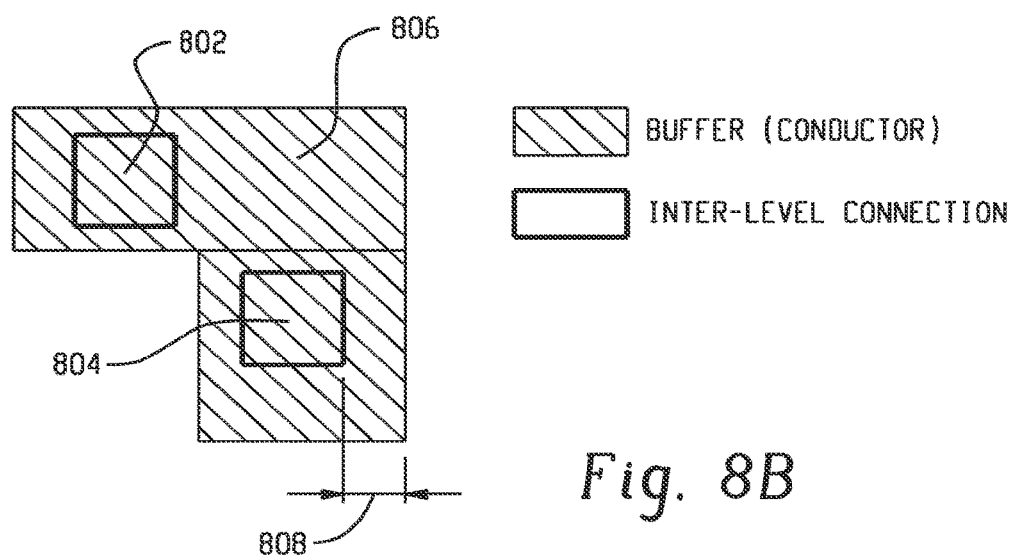

As shown in FIGS. 8A and 8B, an inter-level connection structure includes two vertical via/contacts 802 and 804 and a horizontal buffer 806 that bridges the two vertical via/contacts 802 and 804. The vertical via/contact 802 is in connection with the source electrode structure 126, and the vertical via/contact 804 is in connection with the gate electrode structure 118. A sufficient landing area may be kept on the gate electrode structure 118 for the vertical via/contact 804, as shown in FIG. 8B. For example, a margin 808 may be kept between the vertical via/contact 804 and the gate electrode structure 118.

Figure 9A:
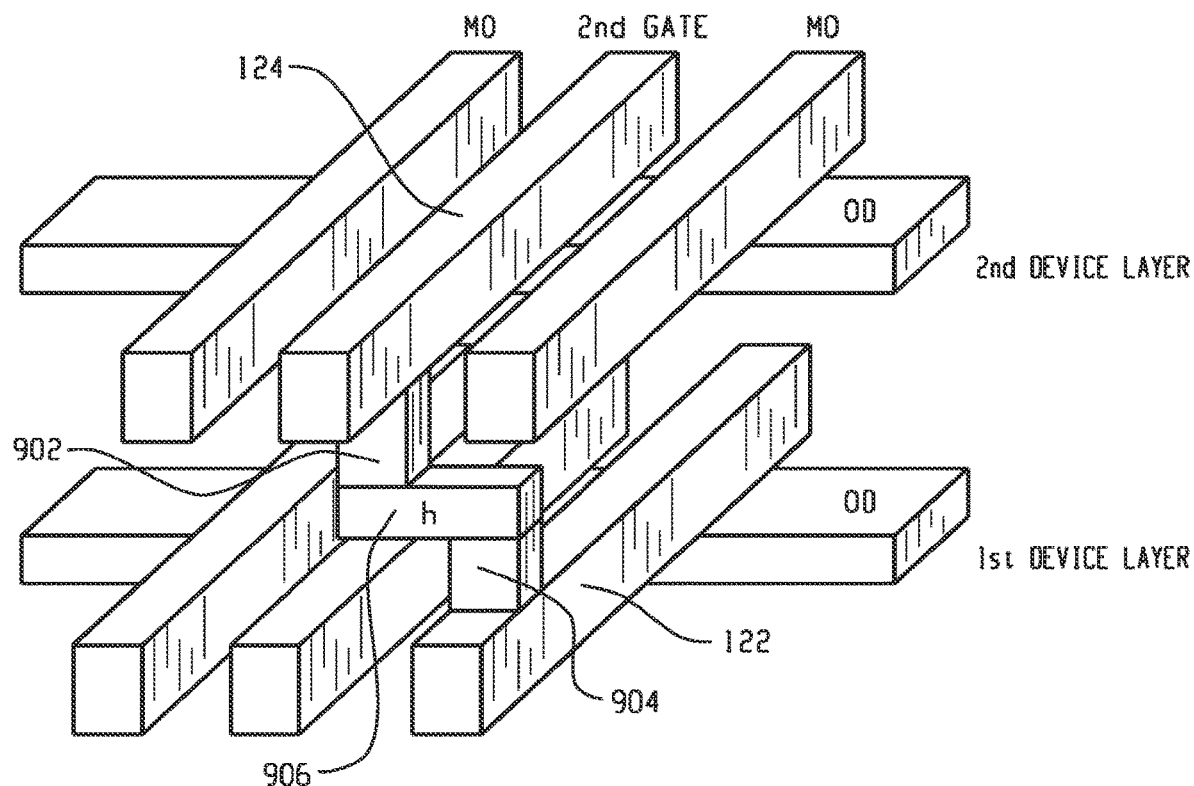
Figure 9B:
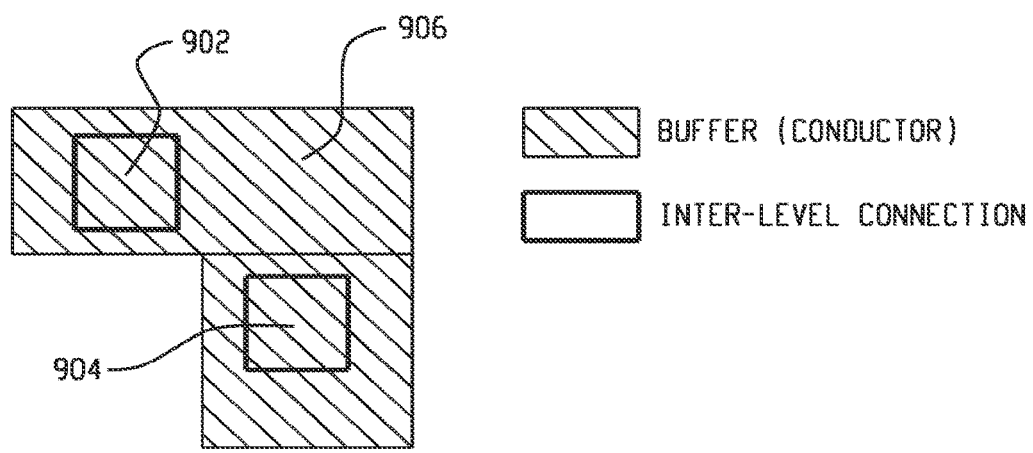

FIGS. 9A and 9B show another inter-level connection structure includes two vertical via/contacts 902 and 904 and a horizontal buffer 906 that bridges the two vertical via/contacts 902 and 904. The vertical via/contact 902 may be in connection with the gate electrode structure 124, and the vertical via/contact 904 may be in connection with the drain electrode structure 122.

Figure 10A:
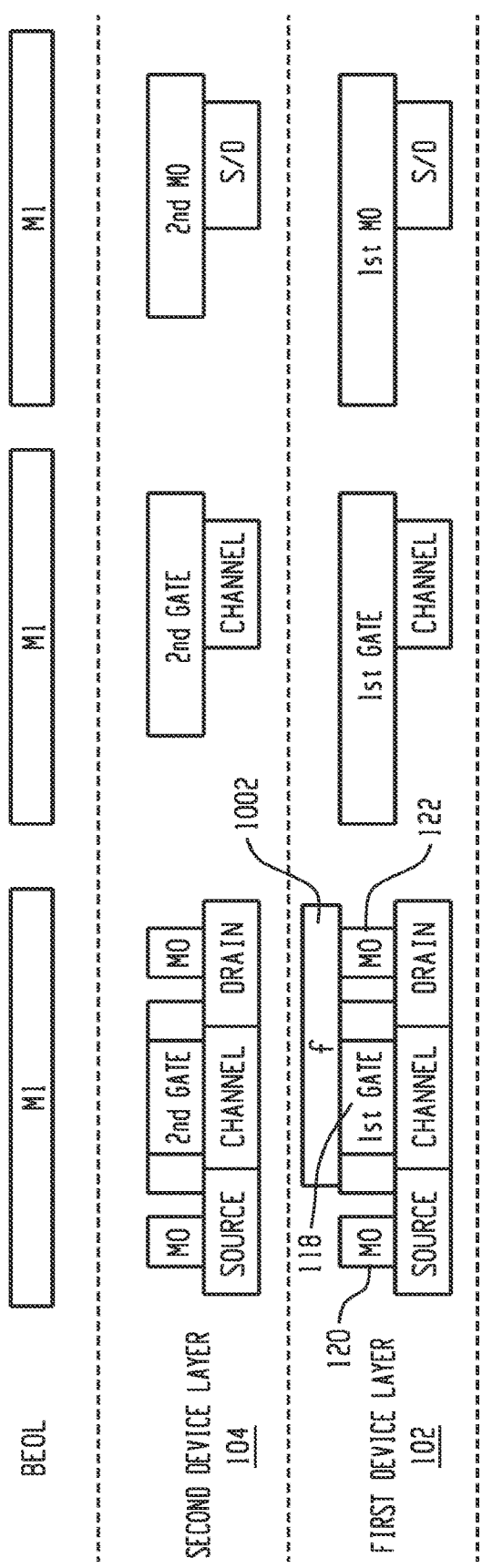
FIGS. 10A-13B depict example diagrams showing different connection structures within a same device layer.
Figure 10B:
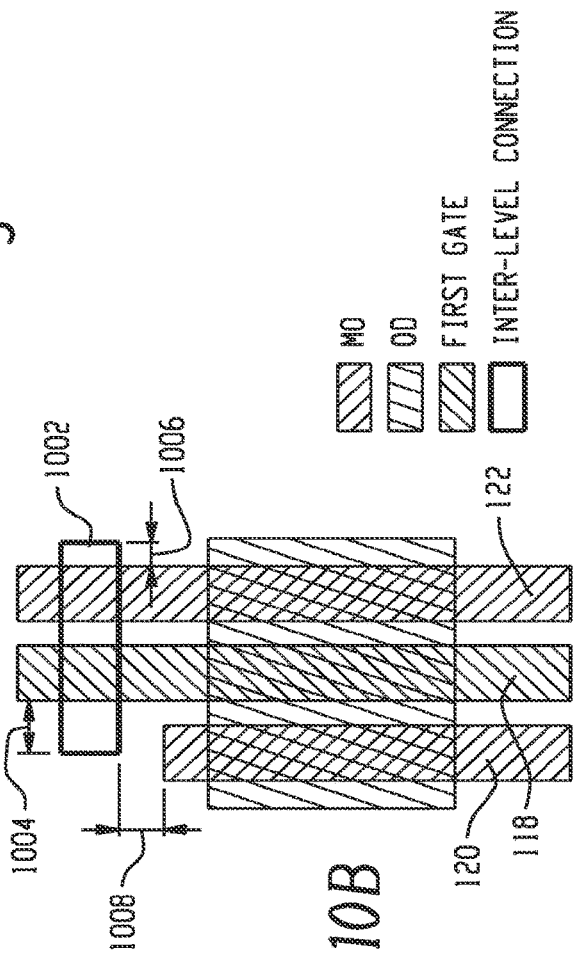
Figure 11A:
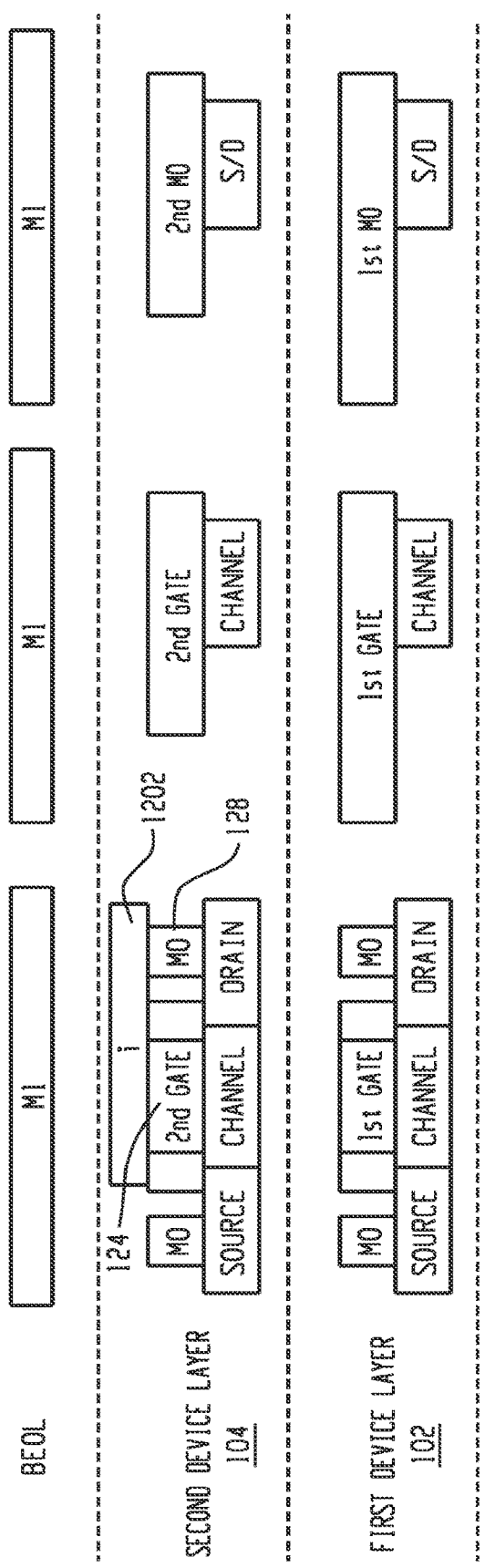
Figure 11B:
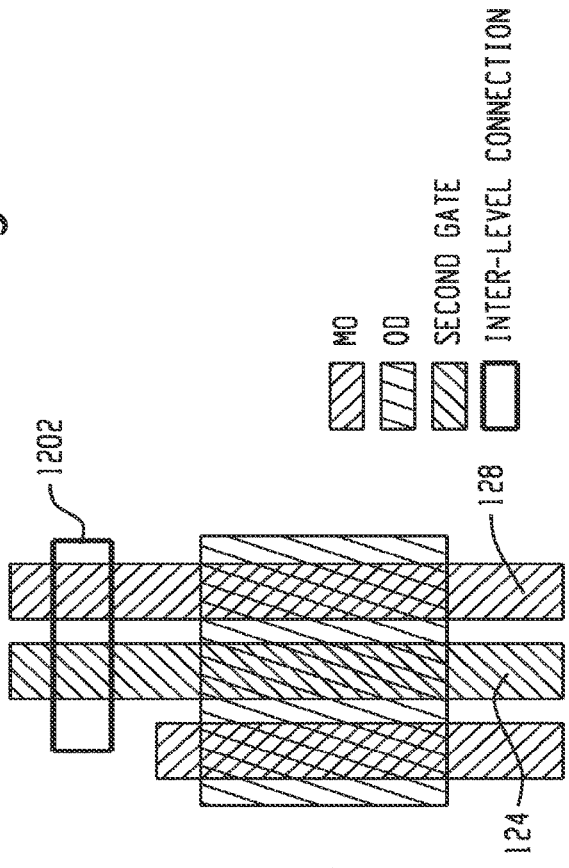

FIGS. 10A-13B depict example diagrams showing different connection structures within a same device layer. As shown in FIGS. 10A and 10B, a connection structure 1002 may be constructed to connect the gate electrode structure 118 and the source/drain electrode structure 122 together. Margins 1004 and 1006 may be properly designed so that the connection structure 1002 extends over substantially the gate electrode structure 118 and the drain electrode structure 122. In addition, a margin 1008 may be kept between the connection structure 1002 and the source electrode structure 120 so that they may not be shorted, as shown in FIG. 10B. Similarly, as shown in FIGS. 11A and 11B, a connection structure 1202 may be constructed to connect the gate electrode structure 124 and the drain electrode structure 128 together.

Figure 12A:
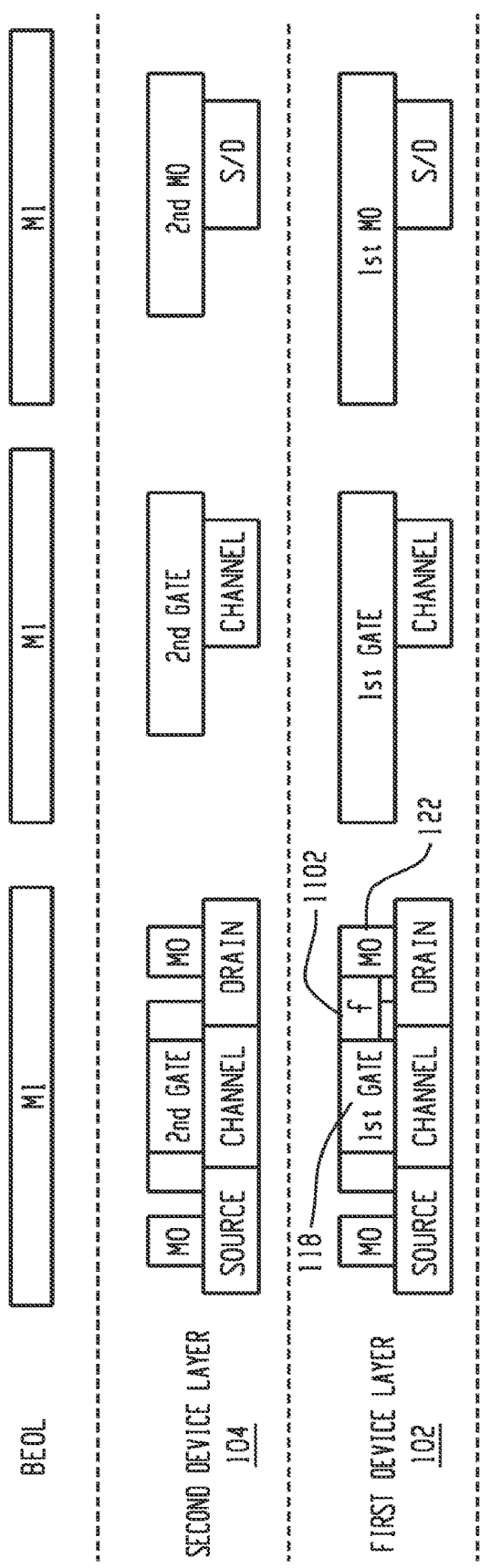
Figure 12B:
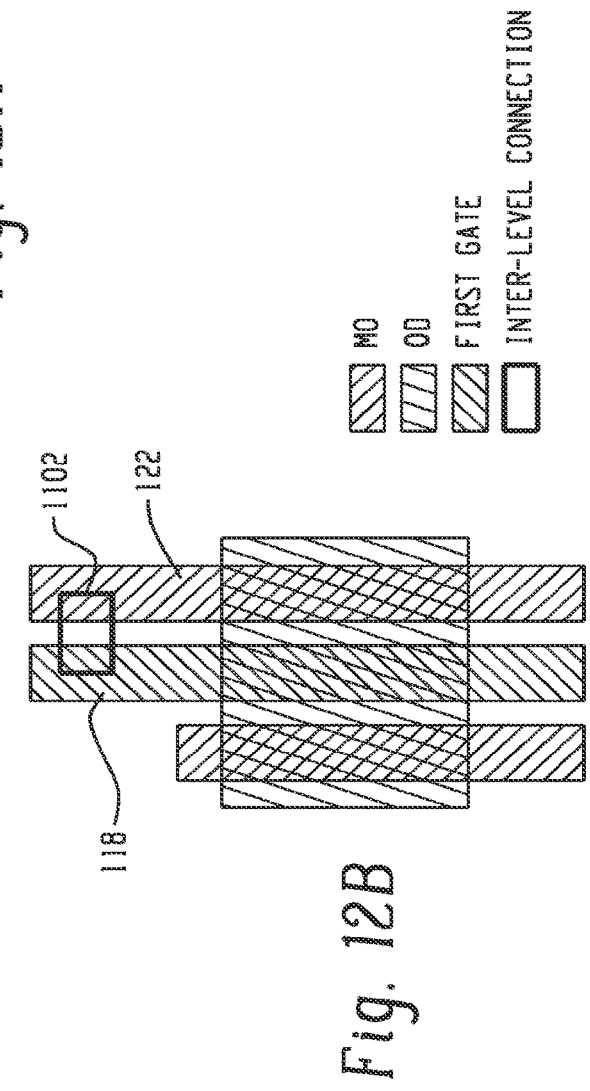
Figure 13A:
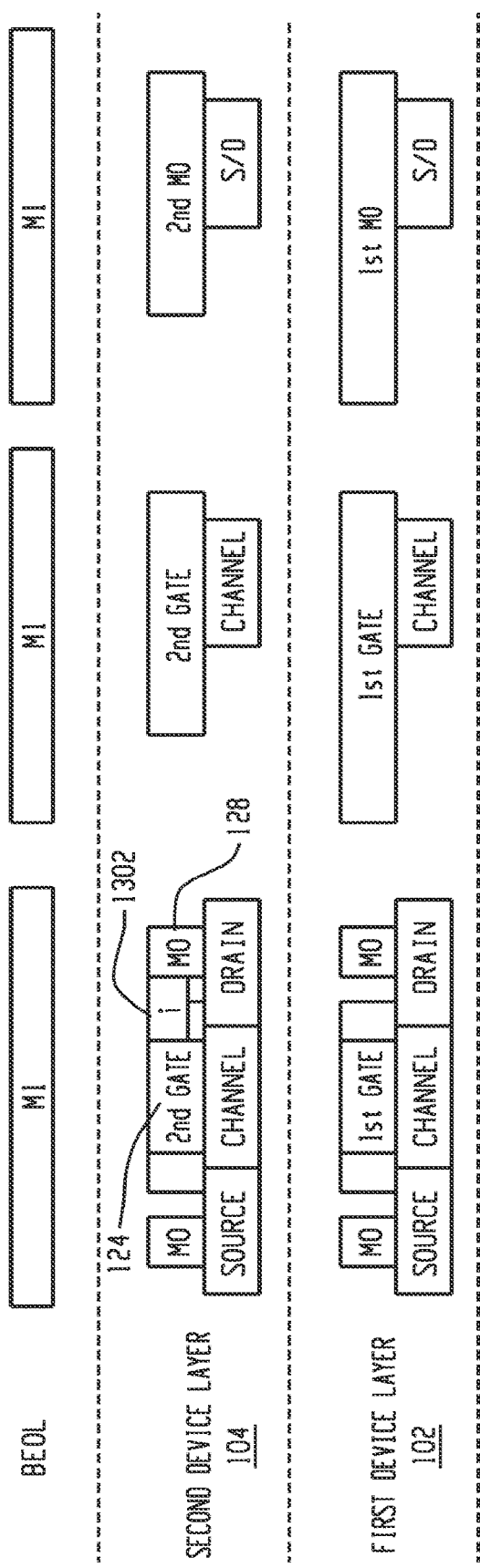
Figure 13B:
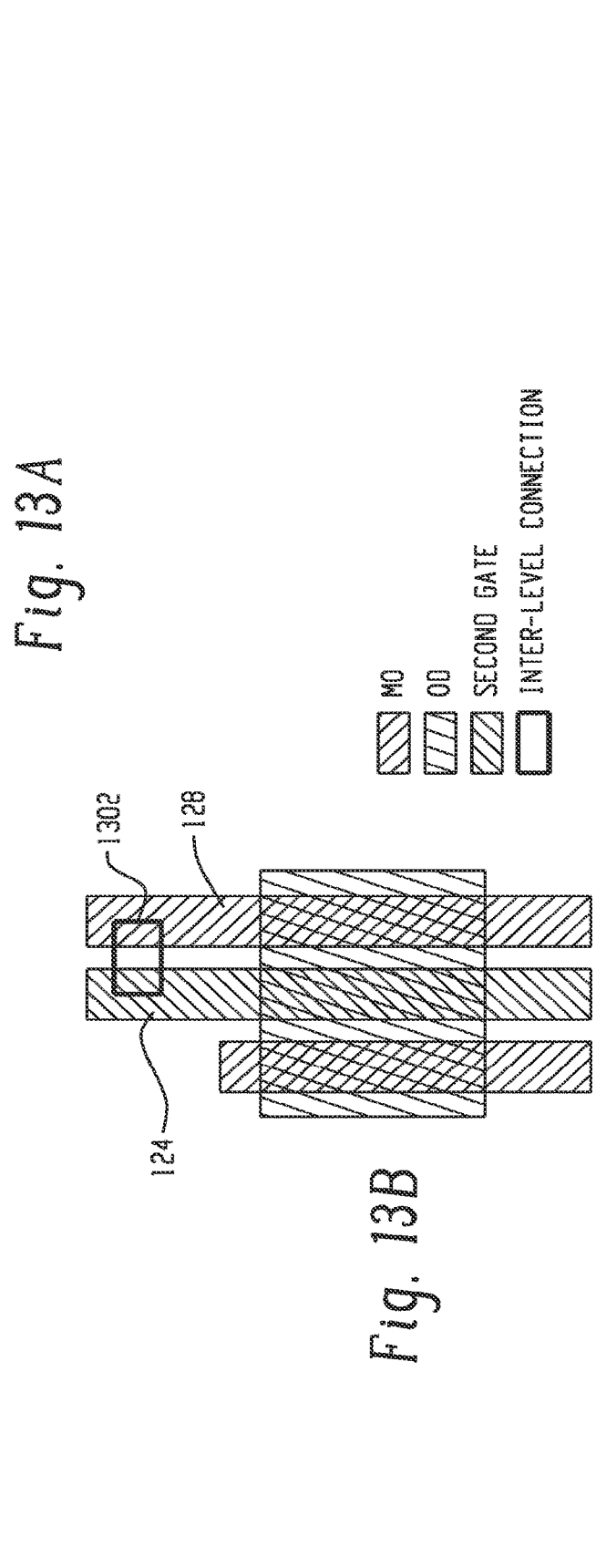

Another connection structure 1102 may be constructed to connect to the gate electrode structure 118 and the drain electrode structure 122, as shown in FIGS. 12A and 12B. The connection structure 1102 may self-align with the gate electrode structure 118 and the drain electrode structure 122, so that a larger overlap margin may be allowed. Similarly, a connection structure 1302 may be constructed to connect to the gate electrode structure 124 and the drain electrode structure 128, as shown in FIGS. 13A and 13B.

Figure 14:
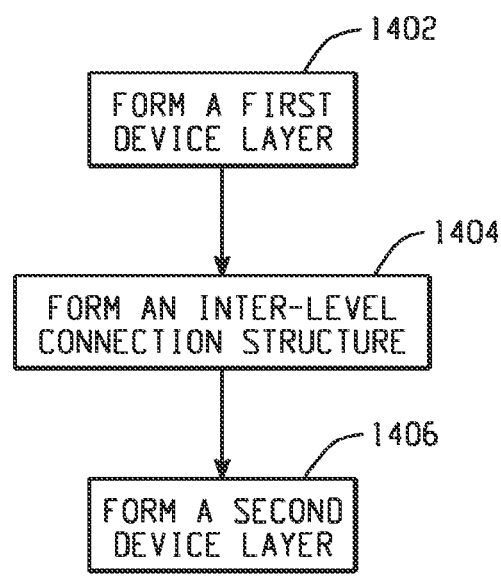
FIG. 14 depicts an example flow chart for fabricating a multi-layer semiconductor device structure.

FIG. 14 depicts an example flow chart for fabricating a multi-layer semiconductor device structure. At 1402, a first device layer may be formed on a substrate. The first device layer includes a first conductive layer and a first dielectric layer formed on the first conductive layer. At 1404, an inter-level connection structure including one or more conductive materials may be formed. The inter-level connection structure may penetrate through at least part of the first dielectric layer and may be connected to the first conductive layer. At 1406, a second device layer may be formed on the first device layer. The second device layer may include a second conductive layer connected to the inter-level connection structure. The first conductive layer may electrically connect to a first electrode structure of a first semiconductor device within the first device layer.

Figure 15:
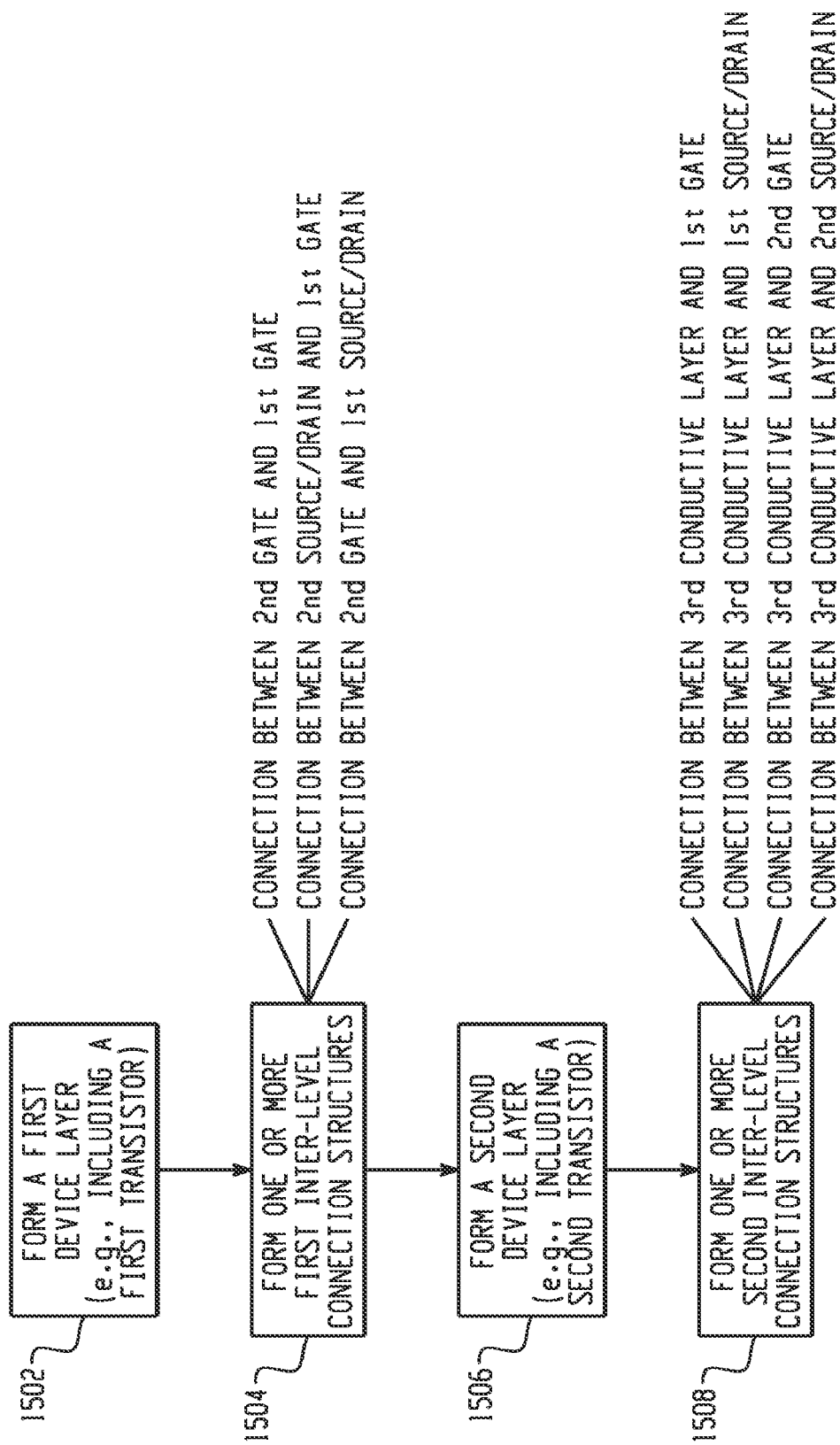
FIG. 15 depicts another example flow chart for fabricating a multi-layer semiconductor device structure.

FIG. 15 depicts another example flow chart for fabricating a multi-layer semiconductor device structure. At 1502, a first device layer may be formed on a substrate. The first device layer includes a first conductive layer and a first dielectric layer formed on the first conductive layer. For example, the first device layer may include a first transistor that contains a first gate electrode structure, a first source electrode structure and a first drain electrode structure. At 1504, one or more first inter-level connection structures including one or more conductive materials may be formed. The first inter-level connection structures may penetrate through at least part of the first dielectric layer and may be connected to the first conductive layer. At 1506, a second device layer may be formed on the first device layer. The second device layer may include a second conductive layer connected to the first inter-level connection structures. For example, the second device layer may include a second transistor that contains a second gate electrode structure, a second source electrode structure and a second drain electrode structure. In some embodiments, a third conductive layer (e.g., one or more metal layers) may be formed on the second device layer, e.g., through one or more BEOL processes. At 1508, one or more second inter-level connection structures including one or more conductive materials may be formed.

In one embodiment, the first inter-level connection structures may include a connection (e.g., the structure 602) between the second gate electrode structure and the first gate electrode structure, a connection (e.g., the structures 802, 804 and 806) between the first gate electrode structure and the second source electrode structure or the second drain electrode structure, and/or a connection (e.g., the structures 902, 904 and 906) between the second gate electrode structure and the first source electrode structure or the first drain electrode structure. As an example, one or more first intra-level connection structures are formed to connect different electrode structures within the first device layer. For example, the first intra-level connection structures may include a connection (e.g., the structure 1002) between the first gate electrode structure and the first source electrode structure or the first drain electrode structure.

In another embodiment, the second inter-level connection structures may include a connection (e.g., the structure 202) between the third conductive layer and the first gate electrode structure, a connection (e.g., the structure 402) between the third conductive layer and the first source electrode structure or the first drain electrode structure, a connection (e.g., the structure 302) between the third conductive layer and the second gate electrode structure, and/or a connection (e.g., the structure 502) between the third conductive layer and the second source electrode structure or the second drain electrode structure. As an example, one or more second intra-level connection structures may be formed to connect different electrode structures within the second device layer. For example, the second intra-level connection structures may include a connection (e.g., the structure 1202) between the second gate electrode structure and the second source electrode structure or the second drain electrode structure.

FIG. 16 depicts yet another example flow chart for fabricating a multi-layer semiconductor device structure. At 1602, a first device layer may be formed on a substrate. The first device layer includes a first conductive layer and a first dielectric layer formed on the first conductive layer. For example, the first device layer may include a first transistor that contains a first gate electrode structure, a first source electrode structure and a first drain electrode structure. At 1604, one or more first inter-level connection structures including one or more conductive materials may be formed. The first inter-level connection structures may penetrate through at least part of the first dielectric layer and may be connected to the first conductive layer. At 1606, a second device layer may be formed on the first device layer. The second device layer may include a second conductive layer connected to the first inter-level connection structures. For example, the second device layer may include a second transistor that contains a second gate electrode structure, a second source electrode structure and a second drain electrode structure. As an example, dummy gate structures and/or dummy source/drain materials may be included in the second device layer. At 1608, one or more second inter-level connection structures including one or more conductive materials may be formed, e.g., by replacing the dummy gates and/or dummy source/drain materials. In some embodiments, a third conductive layer (e.g., one or more metal layers) may be formed on the second device layer, e.g., through one or more BEOL processes. At 1610, one or more third inter-level connection structures including one or more conductive materials may be formed.

In one embodiment, the first inter-level connection structures may include a connection (e.g., the structures 802, 804 and 806) between the first gate electrode structure and the second source electrode structure or the second drain electrode structure, and/or a connection (e.g., the structures 902, 904 and 906) between the second gate electrode structure and the first source electrode structure or the first drain electrode structure. As an example, one or more first intra-level connection structures may be formed to connect different electrode structures within the first device layer. For example, the first intra-level connection structures may include a connection (e.g., the structure 1002) between the first gate electrode structure and the first source electrode structure or the first drain electrode structure.

In another embodiment, the second inter-level connection structures may include a connection (e.g., the structure 602) between the second gate electrode structure and the first gate electrode structure, a connection (e.g., the structures 802, 804 and 806) between the first gate electrode structure and the second source electrode structure or the second drain electrode structure, and/or a connection (e.g., the structures 902, 904 and 906) between the second gate electrode structure and the first source electrode structure or the first drain electrode structure.

In yet another embodiment, the third inter-level connection structures may include a connection (e.g., the structure 202) between the third conductive layer and the first gate electrode structure, a connection (e.g., the structure 402) between the third conductive layer and the first source electrode structure or the first drain electrode structure, a connection (e.g., the structure 302) between the third conductive layer and the second gate electrode structure, and/or a connection (e.g., the structure 502) between the third conductive layer and the second source electrode structure or the second drain electrode structure. As an example, one or more second intra-level connection structures may be formed to connect different electrode structures within the second device layer. For example, the second intra-level connection structures may include a connection (e.g., the structure 1202) between the second gate electrode structure and the second source electrode structure or the second drain electrode structure.

This written description uses examples to disclose the invention, include the best mode, and also to enable a person skilled in the art to make and use the invention. The patentable scope of the invention may include other examples that occur to those skilled in the art. One skilled in the relevant art will recognize that the various embodiments may be practiced without one or more of the specific details, or with other replacement and/or additional methods, materials, or components. For example, certain transistors are described herein as examples, and the concepts, structures, layouts, materials, or operations may also be applicable to other types of semiconductor devices, such as bipolar junction transistors, diodes, capacitors, etc. As an example, the structures, layouts, materials, operations, voltage levels, or current levels related to "source" and "drain" described herein (including in the claims) may be interchangeable as a result of transistors with "source" and "drain" being symmetrical devices. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The term "under" as used herein (including in the claims) may not indicate that a first layer "under" a second layer is directly under and in immediate contact with the second layer unless such is specifically stated; there may be a third layer or other structure between the first layer and the second layer under the first layer. The embodiments of a device or article described herein can be manufactured, used, or shipped in a number of positions and orientations. Persons skilled in the art will recognize various equivalent combinations and substitutions for various components shown in the figures.

What is claimed is:

1. A semiconductor device structure comprising:
 a first device layer including a first gate electrode disposed over a first channel region and extending in a first direction, the first gate electrode including a first main portion overlapping the first channel region and a first extension portion laterally extending from the first main portion beyond the first channel region;

a second device layer including a second gate electrode disposed over a second channel region and extending in the first direction, the second gate electrode including a second main portion overlapping the second channel region and a second extension portion laterally extending from the second main portion beyond the second channel region; and an inter-level connection structure directly connecting a bottom surface of the second extension portion and an upper surface of the first extension portion, wherein in plan view, a distance in the first direction between the second channel region and the inter-level connection structure is equal to or smaller than a width of the inter-level connection structure in the first direction.

2. The semiconductor device of claim 1, wherein an entirety of the second gate electrode fully overlaps with the first gate electrode in plan view.

3. The semiconductor device of claim 1, wherein a width of the first gate electrode in a second direction crossing the first direction is the same as a width of the second gate electrode in the second direction.

4. The semiconductor device of claim 1, wherein in plan view, the distance in the first direction between the second channel region and the inter-level connection structure is equal to or greater than a distance in the first direction between a lateral end of the second extension portion and the inter-level connection structure.

5. The semiconductor device of claim 1, wherein in plan view, the distance in the first direction between the second channel region and the inter-level connection structure is equal to or smaller than a distance in the first direction between the first channel region and the inter-level connection structure.

6. The semiconductor device of claim 1, wherein in plan view, a distance in the first direction between a lateral end of the first extension and the inter-level connection structure is greater than a distance in the first direction between a lateral end of the second extension portion and the inter-level connection structure.

7. The semiconductor device of claim 1, wherein the first channel region is greater in area than the second channel region.

8. A semiconductor device structure comprising:
a first device layer including a first conductive layer disposed in contact with a first source/drain region and extending in a first direction, the first conductive layer including a first main portion contacting and overlapping the first source/drain region and a first extension portion laterally extending from the first main portion beyond the first source/drain region;
a second device layer including a second conductive layer disposed in contact with a second source/drain region and extending in a second direction, the second conductive layer including a second main portion contacting and overlapping the second source/drain region and a second extension portion laterally extending from the second main portion beyond the second source/drain region; and
an inter-level connection structure directly connecting a bottom surface of the second extension portion and an upper surface of the first extension portion,
wherein in plan view, a distance in the first direction between the second source/drain region and the inter-level connection structure is equal to or greater than a distance in the first direction between a lateral end of the second extension portion and the inter-level connection structure.

9. The semiconductor device of claim 8, wherein an entirety of the second conductive layer fully overlaps with the first conductive layer in plan view.

10. The semiconductor device of claim 9, wherein a width of the first conductive layer in a second direction crossing the first direction is the same as a width of the second conductive layer in the second direction.

11. The semiconductor device of claim 8, wherein in plan view, the distance in the first direction between the second source/drain region and the inter-level connection structure is equal to or smaller than a width of the inter-level connection structure in the first direction.

12. The semiconductor device of claim 8, wherein in plan view, the distance in the first direction between the second source/drain region and the inter-level connection structure is equal to or smaller than a distance in the first direction between the first source/drain region and the inter-level connection structure.

13. The semiconductor device of claim 8, wherein in plan view, a distance in the first direction between a lateral end of the first extension and the inter-level connection structure is greater than a distance in the first direction between a lateral end of the second extension portion and the inter-level connection structure.

14. The semiconductor device of claim 8, wherein the first source/drain region is greater in area than the second source/drain region.

15. A semiconductor device structure comprising:
a lower device layer including a first semiconductor device having a first gate electrode disposed over a channel region, a first source/drain electrode connected to a first source/drain region and a first conductive layer, the first conductive layer being a laterally extending portion of the first gate electrode beyond the channel region or the first source/drain electrode beyond the first source/rain region;
a middle device layer including a second conductive layer disposed over the lower device layer;
an upper device layer including a third conductive layer, the upper device layer being formed over the middle device layer; and
a first inter-level connection structure including one or more conductive materials and directly connecting an upper surface of the laterally extending portion of the first conductive layer and a bottom surface of the third conductive layer,
wherein in plan view, a distance between an end of the laterally extending portion of the first conductive layer and the inter-level connection structure is equal to a distance between the second conductive layer and the inter-level connection structure.

16. The semiconductor device of claim 15, wherein the first inter-level connection structure penetrates the middle device layer, and lands on a portion of the first conductive layer other than a portion under which a conductive layer exists within the lower device layer.

17. The semiconductor device of claim 16, wherein a transistor is disposed in the middle layer.

18. The semiconductor device of claim 17, wherein no transistor is disposed in the upper layer.

19. The semiconductor device of claim 17, wherein the second conductive layer is disposed over and in contact with a source or a drain of the transistor.

20. The semiconductor device of claim 17, wherein the second conductive layer is disposed over a channel of the transistor.

* * * * *